(12) United States Patent
Bailey et al.

(10) Patent No.: US 10,433,466 B2
(45) Date of Patent: Oct. 1, 2019

(54) MIXING CHAMBER FOR AIR HANDLING IN AN INFORMATION HANDLING SYSTEM

(71) Applicant: Dell Products L.P., Round Rock, TX (US)

(72) Inventors: Mark Mcgrath Bailey, Round Rock, TX (US); Trey S. Wiederhold, Cedar Park, TX (US); Tyler B. Duncan, Austin, TX (US); Ty R. Schmitt, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 196 days.

(21) Appl. No.: 15/184,861

(22) Filed: Jun. 16, 2016

(65) Prior Publication Data

US 2017/0367223 A1    Dec. 21, 2017

(51) Int. Cl.
*H05K 7/20* (2006.01)
*E04H 5/00* (2006.01)
*E04B 1/348* (2006.01)

(52) U.S. Cl.
CPC ..... *H05K 7/20836* (2013.01); *E04B 1/34869* (2013.01); *E04H 5/00* (2013.01); *H05K 7/20736* (2013.01); *E04H 2005/005* (2013.01)

(58) Field of Classification Search
CPC .......... E04H 2005/005; H05K 7/20836; H05K 7/20736; H05K 7/20709; H05K 7/20145; H05K 7/20; H05K 7/20009; H05K 7/20127; H05K 7/20136; H05K 7/20163; H05K 7/20154; H05K 7/20172; H05K 7/20181; H05K 7/2019; H05K 7/202; H05K 7/20209; H05K 7/20536; H05K 7/206; H05K 7/20609; H05K 7/20618; H05K 7/20636; H05K 7/20645; H05K 7/20654; H05K 7/207; H05K 7/20845; H05K 7/20854; H05K 7/20863; H05K 7/2089; H05K 7/209; H05K 7/20909; H05K 7/20918; H05K 7/20945; H05K 7/20954; H05K 7/20963; H05K 7/20972; H05K 9/0041; G06F 1/20; G06F 1/206
(Continued)

(56) References Cited

U.S. PATENT DOCUMENTS

2009/0117843 A1 *  5/2009  Palmer ..................... F24F 7/06
                                                         454/239
2010/0170277 A1 *  7/2010  Schmitt .............. H05K 7/20745
                                                         62/259.2
(Continued)

*Primary Examiner* — Steven B McAllister
*Assistant Examiner* — Ko-Wei Lin
(74) *Attorney, Agent, or Firm* — Norton Rose Fulbright US LLP

(57) ABSTRACT

A mixing module may be used in a modular data center to provide cooling of air by mixing exterior environment air with warm air exhausted from information handling systems in other modules of the modular data center. The mixing module may include a mixing aisle that provides a low-impedance path for warm and cool air to mix and for a homogenous air mass for cooling IT equipment. The mixing aisle may be divided into two portions separated by dampers to allow for control over the mixing of air in the mixing aisle. The dampers in the mixing aisle, as well as dampers on an intake and exhaust from the mix module, may be controlled to obtain a desired temperature and/or humidity level.

18 Claims, 7 Drawing Sheets

(58) Field of Classification Search
USPC .............................. 454/184, 339, 237–253
See application file for complete search history.

(56) References Cited

U.S. PATENT DOCUMENTS

| | | | |
|---|---|---|---|
| 2011/0256822 A1* | 10/2011 | Carlson | H05K 7/20827 |
| | | | 454/184 |
| 2014/0033751 A1 | 2/2014 | Bailey et al. | |
| 2014/0349563 A1* | 11/2014 | Honda | F24F 1/0007 |
| | | | 454/184 |

* cited by examiner

MIXING CHAMBER FOR AIR HANDLING IN AN INFORMATION HANDLING SYSTEM

CROSS-REFERENCE TO RELATED PATENT APPLICATIONS

This application is related to U.S. patent application Ser. No. 15/182,409 filed Jun. 14, 2016 and entitled "Modular Data Center and Utility Module" and is related to U.S. patent application Ser. No. 15/182,534 filed Jun. 14, 2016 and entitled "Modular Data Center with Passively-Cooled Utility Module," each of which is incorporated by reference.

FIELD OF THE DISCLOSURE

The instant disclosure relates to computer systems. More specifically, portions of this disclosure relate to air handling for information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are generally set-up and operated in specialized spaces called data centers. These data centers decrease costs of operating information handling systems by placing large amounts of equipment in one location, such that the equipment may share support systems. For example, one battery backup system may be set-up for a large amount of equipment. As another example, staff for administering the equipment may be shared between many pieces of equipment. However, there are still inefficiencies with conventional data centers that may be improved, particularly with regards to air handling and cooling an enclosed space within the data center.

SUMMARY

Information technology (IT) equipment, like any other electronic equipment, dissipates energy as heat. Large amounts of IT equipment thus dissipate large amounts of heat. Thus, the large amount of IT equipment located in a data center requires specialized cooling systems to maintain the IT equipment at cool temperatures that allow for efficient processing of and storage of data and that reduce failures of the IT equipment. Conventional cooling systems for data centers involve large air conditioning units to provide cooling to maintain a desired temperature in the data center. However, such cooling systems consume large amounts of energy. This consumed energy represents an operational cost for the data center that does not directly lead to the processing or storage of data. Thus, it would be desirable to reduce this operational cost. Improvements in cooling systems for data centers may be obtained using a prefabricated infrastructure module (PIM) for mixing, or a "mixing module." The mixing module may provide additional flexibility in air handling for a data center, such as by operating in configurations that consume less power by de-activating energy-consuming cooling systems.

A mixing module for a data center may allow controlled mixing of air from enclosed space of the data center with air from the exterior environment. By using air from the exterior environment, energy consumption may be decreased by decreasing the time that active cooling, such as air conditioning units, is required. For example, when external air is sufficiently cool enough, the external air may be mixed with air from the enclosed space and then recirculated through the data center without additional cooling. This configuration may benefit administrators of the data center by reducing power consumption by the cooling system. The same mixing module may also support other configurations, which may be switched between by controlling dampers on various intakes and exhausts of the mixing chamber. For example, the mixing module may also support disabling the recirculation through the mixing chamber, such that external air is brought in through the mixing module, circulated through an active cooling system to form cool air, which is provided to the IT equipment, and then the resulting warm air exhausted to the external environment. This configuration may be beneficial when the external conditions would be insufficient to cool the IT equipment, such as on a hot, humid day. In another configuration, the mixing of air in the mixing module may be performed and the mixed air then cooled with the cooling system.

The mixing module may include several intakes and/or exhausts for air to and/or from the mixing module. One intake may be an interior intake opening that receives warm air from the IT equipment. In some embodiments, the IT equipment may be organized in racks in an enclosed space, such that a separate cool aisle and warm aisle may be formed. The interior intake opening for the mixing module may be positioned to receive warm air from the warm aisle. The mixing module may also include an exterior intake opening positioned to receive air from an external environment. In some embodiments of the mixing module, a single exterior intake opening may be used regardless of the operating mode of the mixing module. That is, the same single exterior intake opening may be used whether operating in a mode that mixes and recirculates air or operating in a mode that cools exterior air and exhausts warm air rather than mix and recirculate.

The mixing module may also include a mixing aisle. The mixing aisle may be configured to receive air from the interior intake opening and the exterior intake opening. The mixing aisle may provide a low impedance path for airflow to recycle through an intake opening and back to a cooling system and/or IT equipment. For example, the mixing aisle may traverse substantially an entire length of the mixing module multiple times while passing through the multiple levels within the mixing module. The long distance may provide sufficient time for air of different temperature to mix into a homogenous airflow. The distance through the mixing aisle may provide space for the air received from various intake openings to be mixed to obtain a homogenous air mass of desired temperature and/or humidity for recirculation through the IT equipment. The mixing aisle may include a set of mix dampers that divide the mixing aisle into two or more sections. One section of the mixing aisle may include the interior intake opening, and another section of the mixing aisle may include the exterior intake opening. When the mix dampers are closed, the air from the interior intake opening may be prevented from mixing with air from the exterior intake opening. In this configuration, air from the exterior intake opening may be directly supplied to a recirculation opening of the mixing module, and thus to a cooling system or IT equipment directly without mixing with other air.

In some embodiments, the mixing module may be configured to fit modular data centers. For example, the mixing module may be sized to fit on top of or next to an information technology (IT) module. When configured to attach to a cooling module, the mixing module may include a recirculation opening positioned to match an opening to the cooling module, wherein the recirculation opening receives air from the mixing aisle and allows the air to flow into the cooling module. When configured to attach to an IT module, the mixing module may include an interior intake opening positioned to match an opening from the IT module that connects the mixing module to a warm aisle of the IT module. However, the mixing module may also be configured as a permanent or temporary fixture on other types of data centers.

According to one embodiment, a mixing module may be configured to provide air handling for an information handling system in an enclosed space. The enclosed space may be part of a modular data center, such as an information technology (IT) module. The mixing module may include an interior intake opening configured to receive warm air from a warm aisle of the enclosed space; an exterior intake opening configured to receive air from an exterior environment; a mixing aisle configured to receive air from the interior intake opening and from the exterior intake opening and further configured to allow mixing of air from the warm aisle and air from the exterior environment; and/or a recirculation opening coupled to the mixing aisle and to a cooling system and configured to output mixed air from the mixing aisle to the cooling system for recirculation through the enclosed space to cool the information handling system.

In certain embodiments, the exterior intake opening may include a single opening configured to receive air from the exterior environment when the mixing module is configured for air conditioning by mixing and when the mixing module is configured for air conditioning by cooling; the mixing aisle may be divided into two portions by a set of mix dampers; the set of mix dampers may be configured in one mode to be at least partially open to allow the mixing of the warm air and air from the exterior environment; the set of mix dampers may be configured in one mode to be closed to allow only air from the exterior environment to flow to the cooling system; the mixing module may include intake dampers in the exterior intake opening, wherein the intake dampers are configured to open and close to control airflow from the external environment into the mixing aisle; the mixing module may include an exhaust opening coupled to the mixing aisle and configured to allow exhaust of air from the mixing aisle to the exterior environment; the exhaust opening may include exhaust dampers, wherein the exhaust dampers are configured to open and close to control airflow from the mixing aisle to the external environment; and/or the mixing module may include multiple levels, wherein the mixing aisle traverses substantially an entire length of the mixing module multiple times while passing through the multiple levels.

According to another embodiment, an information handling system may include an enclosed space for information for information technology (IT) equipment, wherein the enclosed space comprises a first region of warmer air and a second region of cooler air; a cooling system attached to the enclosed space; and/or a mixing module configured to provide air handling for the enclosed space. The mixing module may include an interior intake opening configured to receive the warmer air from the first region of the enclosed space; an exterior intake opening configured to receive air from an exterior environment; a mixing aisle configured to receive air from the interior intake opening and from the exterior intake opening and further configured to allow mixing of the warmer air and air from the exterior environment; and/or a recirculation opening coupled to the mixing aisle and to the cooling system and configured to output mixed air from the mixing aisle to the cooling system for recirculation through the enclosed space to cool the information handling system. The information handling system may also include a set of mix dampers configured to divide the mixing aisle into two portions and configured to open and close to control airflow through the mixing aisle. In some embodiments, in a first mode, the set of mix dampers are at least partially open to allow the mixing of the warmer air and air from the exterior environment, and in a second mode, the set of mix dampers are closed to allow only air from the exterior environment to flow to the cooling system.

In certain embodiments, the mixing module may include a single opening configured to receive air from the exterior environment when the mixing module is configured for air conditioning by mixing and when the mixing module is configured for air conditioning by cooling; the mixing module further may also include intake dampers in the exterior intake opening, wherein the intake dampers may be configured to open and close to control airflow from the external environment into the mixing aisle; the mixing module may also include an exhaust opening coupled to the mixing aisle and configured to allow exhaust of air from the mixing aisle to the exterior environment, wherein the exhaust opening includes exhaust dampers configured to open and close to control airflow from the mixing aisle to the external environment; the mixing module may include multiple levels, wherein the mixing aisle traverses substantially an entire length of the mixing module multiple times while passing through the multiple levels; and/or the enclosed space may be part of an information technology (IT) module, wherein the mixing module may be configured to attach to the information technology (IT) module and a cooling module.

According to another embodiment, a method may include receiving warm air from an enclosed space containing information technology (IT) equipment for information handling systems; receiving air from an exterior environment; mixing, in a mixing aisle, the warm air from the enclosed space with the air from the exterior environment; and/or recirculating the mixed air through a cooling system and into the enclosed space for cooling the information technology (IT) equipment.

In some embodiments, the method may further include operating mixing dampers to control the exit of air from the mixing aisle to be recirculated to switch between the first mode and the second mode; operating exhaust dampers to control exhaust of warm air to control a temperature within the enclosed space; and/or operating intake dampers to control intake of exterior air to control a temperature within the enclosed space. The steps of operating the various dampers may be executed by a controller based, in part, on a set of predefined rules, adaptive logic such as neural networks, and/or sensor inputs.

In certain embodiments, the mixed air may be recirculated in a first mode, and the method may also include operating in a second mode by directly cooling air from the exterior environment without mixing; the received air from the exterior may be received through a single opening whether operating in the first mode or the second mode;

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are described below as installed in modular data centers. However, modular data centers are only one arrangement that may employ mixing modules as described herein. Mixing modules of some embodiments may be used as part of an air handling system for any enclosed space, regardless of whether such enclosed space is part of a modular data center or contains information technology (IT) equipment that is part of an information handling system. One example of a modular data center containing an enclosed space for IT equipment that may be part of an information handling system is shown in FIG. 1.

Figure 1:
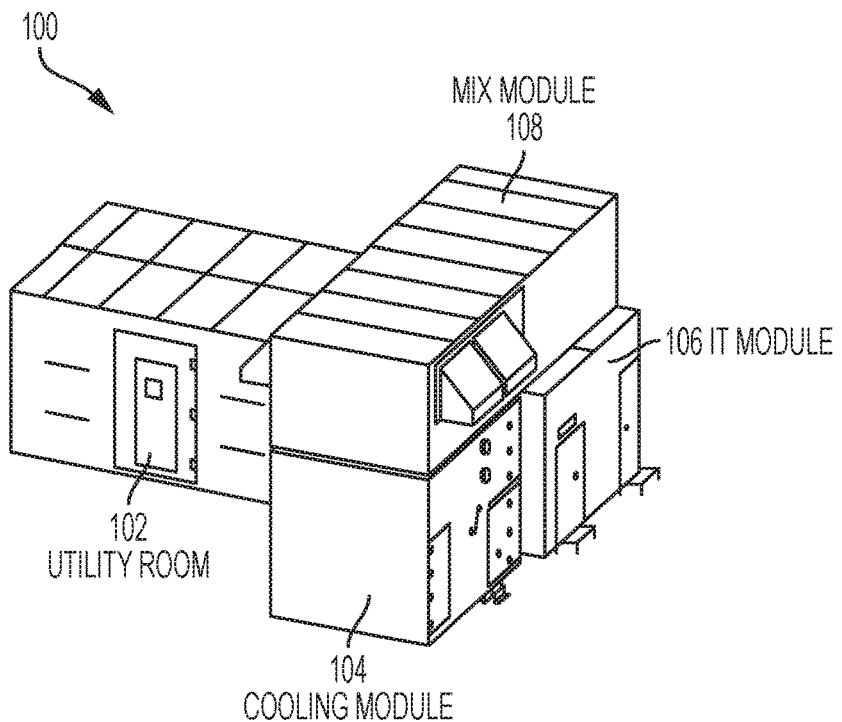
FIG. 1 is a perspective view of a modular data center with a mix module according to one embodiment of the disclosure.

FIG. 1 is a perspective view of a modular data center with a mix module according to one embodiment of the disclosure. A modular data center 100 may include an information technology (IT) module 106, which may be an enclosed space housing IT equipment for an information handling system. The IT module 106 may be attached to a cooling module 104, or more generally an air handling unit (AHU) module, and a utility module 102. The cooling module 104 may include one or more air handling systems, such as an air conditioner for cooling air in the IT module 106. The IT module 106 may also be attached to the utility module 102 that may provide utilities, such as electrical service, and/or access to the IT equipment in the IT module 106. A mix module 108 may be attached to the cooling module 104 and the IT module 106. Several non-limiting embodiments of the mix module 108 are described herein. However, generally, the mix module 108 may allow for mixing of air from several sources, in which the mixed air may be recirculated through the cooling module 104 and/or the IT module 106. Additional details regarding the modular data center 100 as may be provided according to some embodiments, including the IT module 106 and the utility module 102, are described in U.S. patent application Ser. No. 15/182,409 entitled "Modular Data Center with Utility Module," which is incorporated by reference in its entirety.

Figure 2:
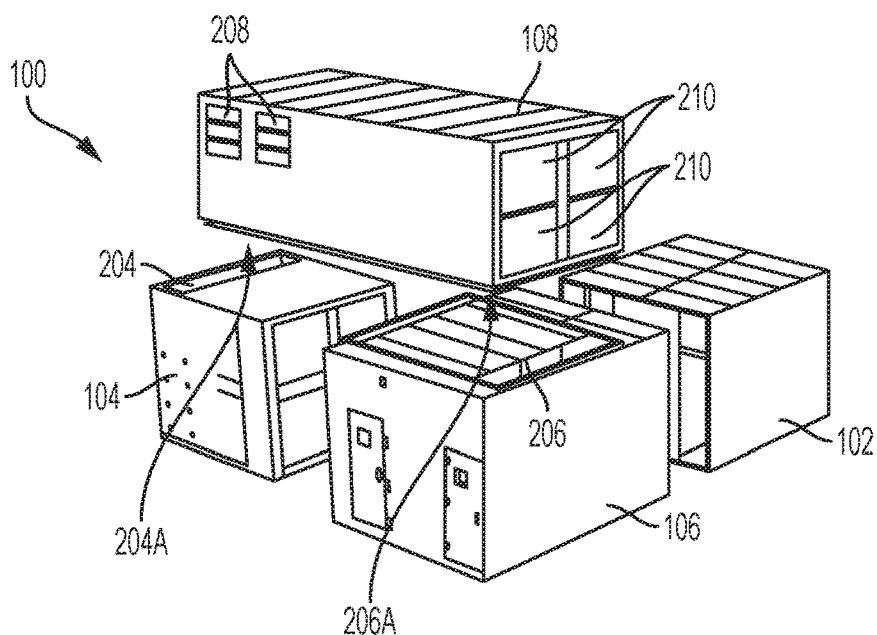
FIG. 2 is an exploded view of a modular data center with a mix module showing openings between the modules according to one embodiment of the disclosure.

Openings of the various modules are shown in an exploded view of the modular data center in FIG. 2. FIG. 2 is an exploded view of a modular data center with a mix module showing openings between the modules according to one embodiment of the disclosure. The IT module 106 may include an opening 206 to a warm aisle, or other warm region, around IT equipment in the IT module 106. The opening 206 may match an interior intake opening 206A on the mix module 108 to allow warm air from the IT module 106 to enter the mix module 108. The mix module 108 may include one or more exterior exhaust openings 210 that may allow warm air entering the mix module 108 to be exhausted to an exterior environment. The exterior exhaust openings 210 may include a set of exterior exhaust dampers (not shown) within the openings 210 to allow opening, partially closing, and/or closing of the openings 210. The exterior exhaust dampers may be configured to open and close to control airflow from the mix module 108 to the exterior environment and thus, for example, control a temperature or humidity of mixed air in the mix module 108. The mix module 108 may also include one or more exterior intake openings 208. The exterior intake opening 208 receive, into the mix module 108, air from the exterior environment. A set of exterior intake dampers (not shown) may be included in the opening 208 to regulate airflow from the exterior environment into the mix module 108. Air from the mix module 108 may be output through a recirculation opening 204A into an opening 204 of the cooling module 104. The air may then be cooled in cooling module 104 or passed through the cooling module 104 without cooling to the IT module 106 to cool IT equipment. In some embodiments, additional equipment may be included to facilitate airflow, such as filters between the openings.

Figure 3A:
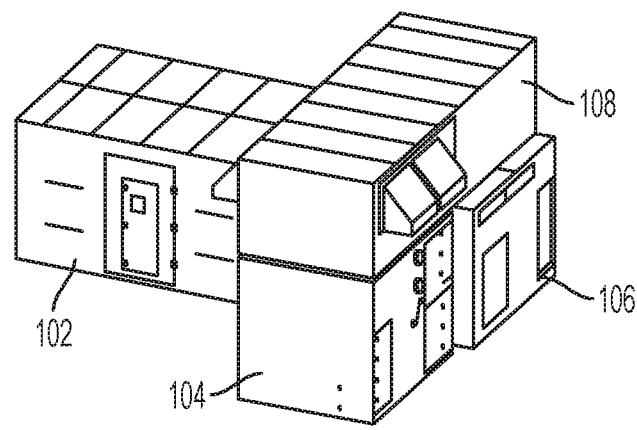
FIG. 3A is a perspective view of a modular data center configured with a single stamp according to one embodiment of the disclosure.
Figure 3B:
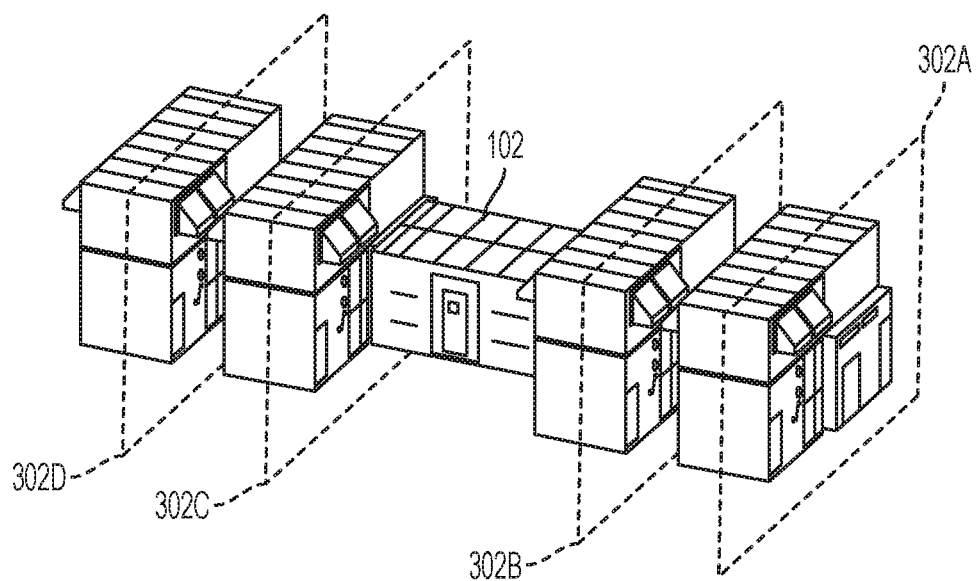
FIG. 3B is a perspective view of a modular data center configured with multiple stamps according to one embodiment of the disclosure.

A data center may include one or more mix modules, such as the mix module 108 shown in FIG. 1 and FIG. 2. Different configurations of a data center including a mix module are shown in FIG. 3A and FIG. 3B. The mix module 108, IT module 106, and cooling module 104 may form a stamp (e.g., stamp 302A). This stamp configuration may be duplicated with additional modules and attached to and share the utility module 102. FIG. 3A is a perspective view of a modular data center configured with a single stamp according to one embodiment of the disclosure. The configuration of FIG. 3A is similar to that of FIG. 1 and FIG. 2. The utility module 102 supports a single IT module 106 with attached cooling module 104 and mix module 108. In another embodiment, several mix modules may be present in a modular data center as shown in FIG. 3B. FIG. 3B is a perspective view of a modular data center configured with multiple stamps according to one embodiment of the disclosure. For example, stamps 302B, 302C, and 302D are also attached to utility module 102 and include mix modules. Although each stamp is shown with a separate mix module and cooling module, mix modules and/or cooling modules may be shared between IT modules 106 of different stamps.

Figure 4A:
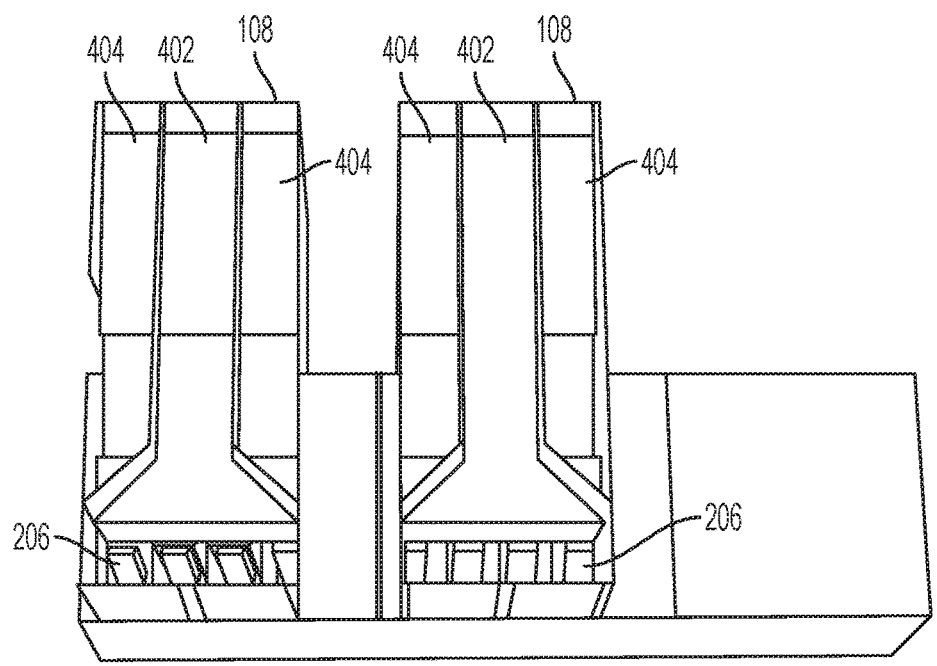
FIG. 4A is a top-down view of a mixing module showing the interior of the mixing module according to one embodiment of the disclosure.
Figure 4B:
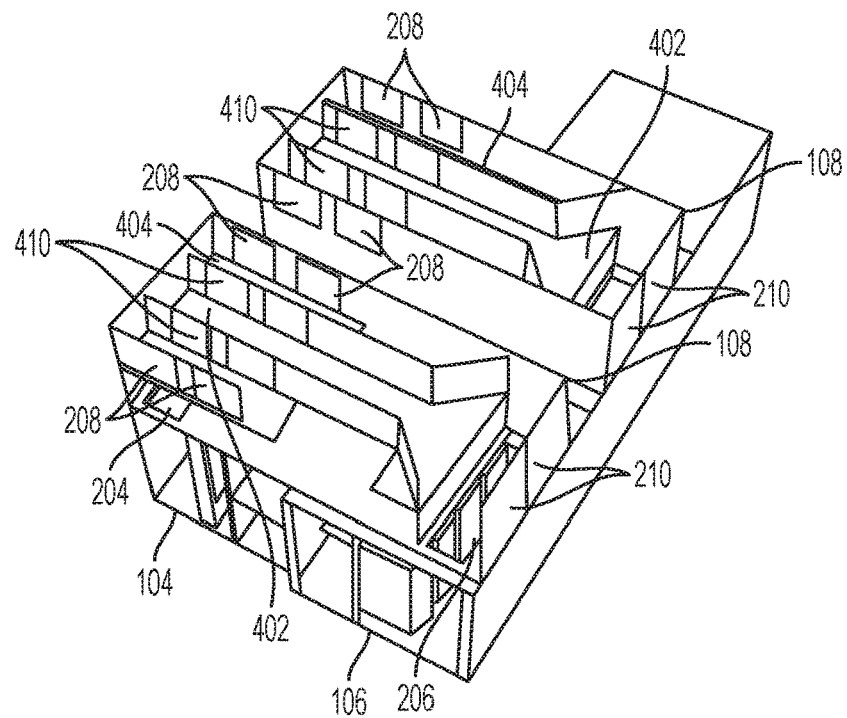
FIG. 4B is a perspective view of a mixing module showing the interior of the mixing module according to one embodiment of the disclosure.

The interior of the mix module 108 may be configured to allow mixing of air from different sources to obtain air with certain characteristics, such as a desired temperature and/or humidity. One configuration for an interior of the mix module 108 is shown in FIG. 4A and FIG. 4B. FIG. 4A is a top-down view of a mixing module showing the interior of the mixing module according to one embodiment of the disclosure. The mix module 108 may include a mixing aisle in one or more portions. As shown in FIG. 4A, the mixing aisle is divided into a first portion 402 and a second portion 404.

Additional details of one embodiment of the mix module 108 are shown in the perspective view of FIG. 4B. FIG. 4B is a perspective view of a mixing module showing the interior of the mixing module according to one embodiment of the disclosure. The first portion 402 of the mixing aisle is shown receiving air from an interior intake opening of the mix module 108 that connects to opening 206 of the IT module 106. Thus, warm air from the warm aisle of the IT module 106 enters the first portion 402 of the mixing aisle. From the first portion 402, the warm air may exit through an exterior exhaust opening 210 and/or a set of mix dampers 410. The mix dampers 410 separate the first portion 402 from the second portion 404 of the mixing aisle. When the mix dampers 410 are open, warm air from the opening 206 flows through the first portion 402 and into the second portion 404. In the second portion 404, the warm air may be mixed with air from the exterior environment that is received through exterior intake openings 208. A set of exterior intake dampers (not shown) in the openings 208 may allow regulation of the entry of air to control a temperature and/or humidity of the mixed air. As the air progresses down the length of the mix module, and in some embodiments additional lengths of the mix module on different levels, a homogeneous air mass may be created with a desired temperature and/or humidity. That mixed air may then exit the mix module 108 through recirculation opening 204.

The mix dampers 410 may be operated to control a mode of operation of the mix module 108 in supporting the IT module 106. As described above, the mix dampers 410 may be at least partially opened to allow warm air from the opening 206 to enter the second portion 404 from the first portion 402. The warm air and cooler exterior air then mixes in the second portion 404. The mix dampers 410 may provide a variable state, in which a controller can adjust the dampers 410 to obtain a desired temperature of the mixed air at the recirculation opening 204. The mix dampers 410 may also be closed to separate the first portion 402 from the second portion 404. With the mixing aisle separated into two portion, the warm air received in the first portion 402 may be exhausted out exterior exhaust openings 210 and exterior air received through the exterior intake openings 208 may be provided to the recirculation opening 204 for passing through and/or cooling by cooling module 104. Dampers (not shown) in the exterior exhaust openings 210 may be used to control the exit of air from the first portion 402 as described below. Additional modes of operation may also be supported by mix module 108 by controlling dampers throughout the mix module 108 and/or components within the cooling module 104 and IT module 106.

Figure 5:
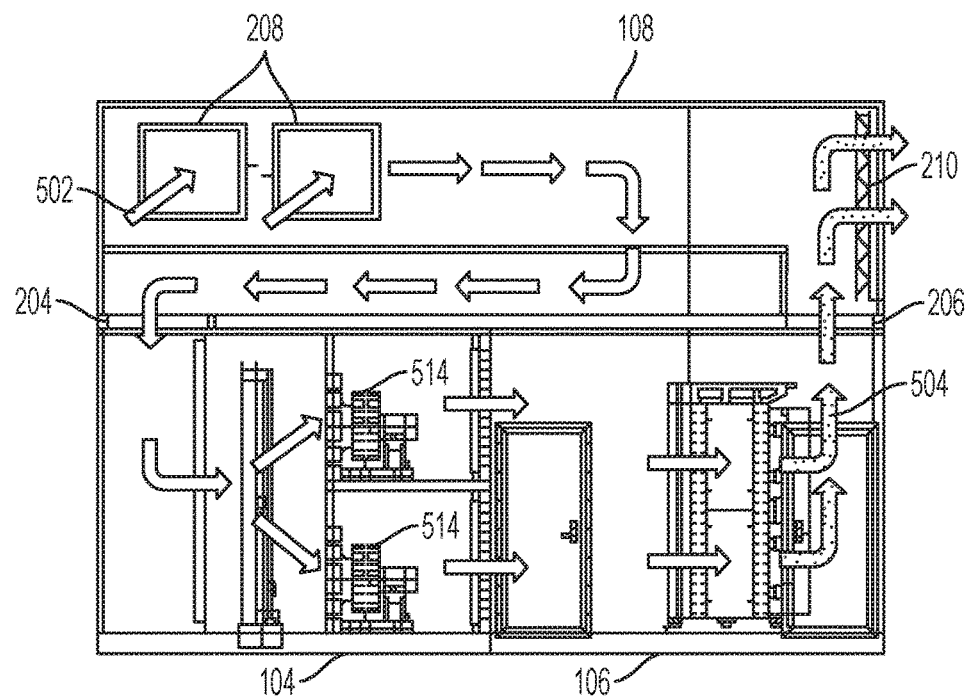
FIG. 5 is a cross-sectional view of a data center showing airflow in the data center when mix dampers are closed and exterior intake air is used to cool the IT equipment according to one embodiment of the disclosure.

Some modes of operation for the mix module 108 are described with reference to FIG. 5, FIG. 6, FIG. 7, and FIG. 8. A no-additional cooling operation mode is shown in FIG. 5. FIG. 5 is a cross-sectional view of a data center showing airflow in the data center when mix dampers are closed and exterior intake air is used to cool the IT equipment according to one embodiment of the disclosure. In the no-additional cooling operation mode, the mix dampers 410 may be closed. Cool air 502 from the exterior environment is pulled in through exterior intake openings 208 and passed through second portion 404 of the mixing aisle to the recirculation opening 204. When the exterior environmental conditions are satisfactory, the cool air 502 may be passed through the IT module 106 with little or no conditioning. In particular, when the temperature is sufficiently cool enough, the air 502 may be passed to the IT module 106 with no additional cooling. The cool air 502 is blown by fans 514 into enclosed space for IT equipment, such as in the IT module 106. The cool air 502 cools IT equipment in IT module 106 and exits as warm air 504 through the exterior exhaust openings 210. When the outside air is too cool, the warm air 504 may be recirculated through the mixing aisle to mix with the outside air and re-enter the IT Module 106 in the mixing operation mode described below.

Figure 6:
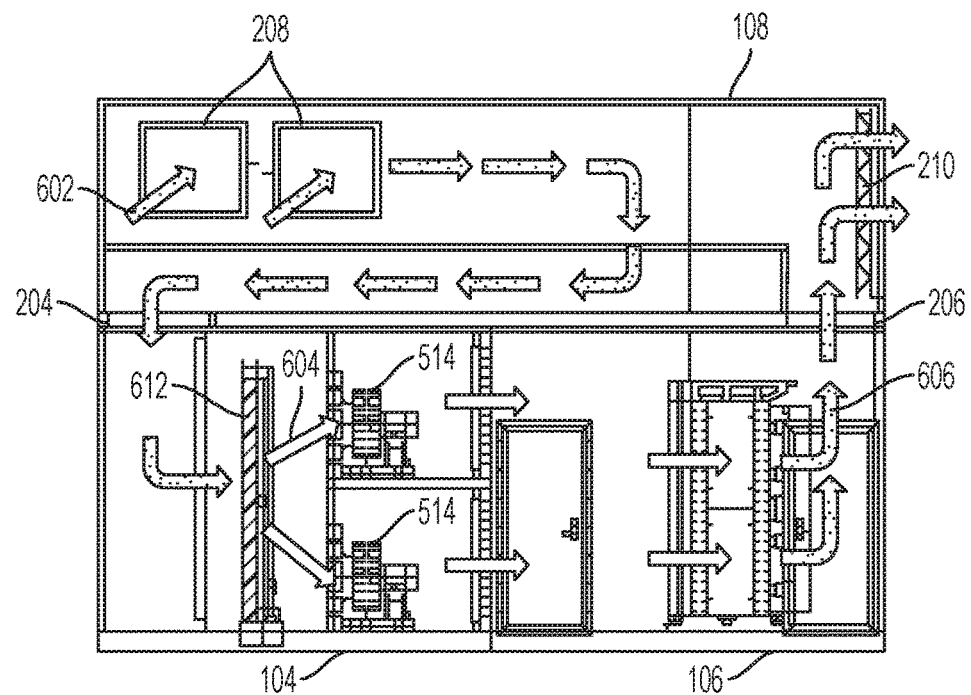
FIG. 6 is a cross-sectional view of a data center showing airflow in the data center when mix dampers are closed and exterior intake air is cooled and then used to cool the IT equipment according to one embodiment of the disclosure.

When exterior environmental conditions are not satisfactory the air may be processed, such as cooled, before passing the air through to the IT module. A cooling operation mode is shown in FIG. 6. FIG. 6 is a cross-sectional view of a data center showing airflow in the data center when mix dampers are closed and exterior intake air is cooled and then used to cool the IT equipment according to one embodiment of the disclosure. In a cooling operation mode, the mix dampers 410 may be closed. Warm air 602 from the exterior environment is pulled in through exterior intake openings 208 and passed through the mixing aisle to the recirculation opening 204. When the exterior environmental conditions are unsatisfactory, the warm air 602 may be processed before being passed through the IT module 106. In particular, when the temperature is not sufficiently cool enough, the warm air 602 may be cooled by cooling system 612 to form cool air 604 and blown by fans 514 into enclosed space for IT equipment, such as in the IT module 106. The air cools IT equipment in IT module 106 and exits as warm air 606 through the exterior exhaust openings 210.

Figure 7:
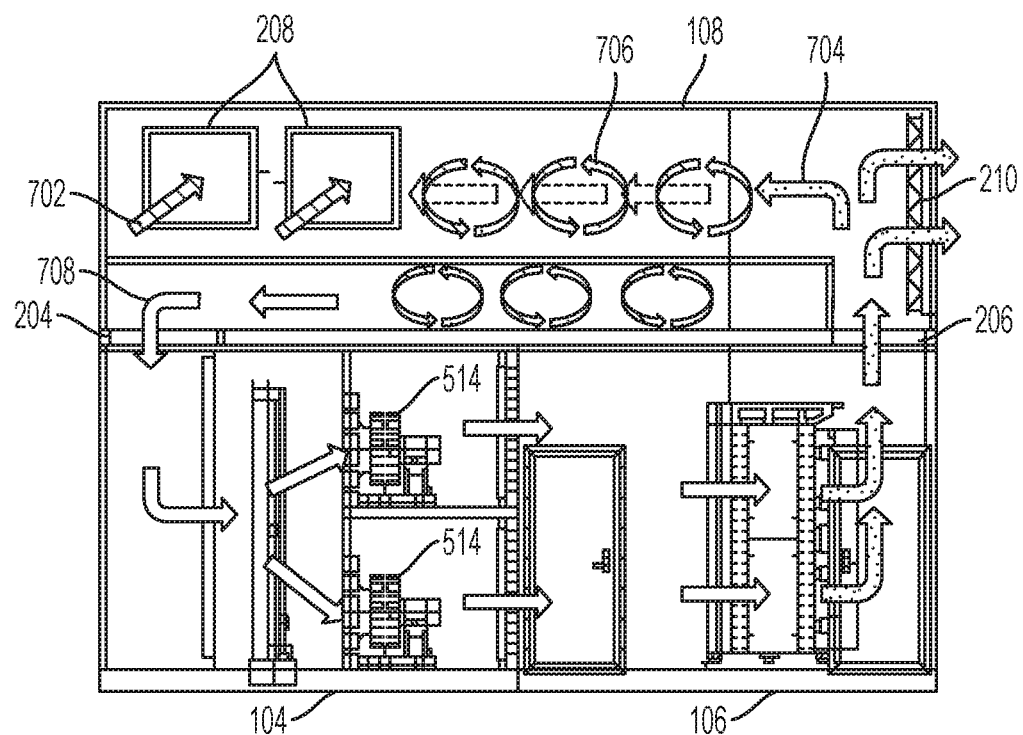
FIG. 7 is a cross-sectional view of a data center showing airflow in the data center when mix dampers are open and air is recirculated from an interior intake opening to cool the IT equipment according to one embodiment of the disclosure.

The mix dampers may be opened to allow recirculation of air through the IT module with little or no additional processing by mixing air from the exterior environment with warm air from the IT module. A mixing operation mode is shown in FIG. 7. FIG. 7 is a cross-sectional view of a data center showing airflow in the data center when mix dampers are open and air is recirculated from an interior intake opening to cool the IT equipment according to one embodiment of the disclosure. Warm air 704 may be received from IT module 106 through opening 206. The warm air 704 may mix with cooler air 702 received from the exterior environment through exterior intake openings 208. Mixed air 706 travels down the mixing aisle to form homogenous cool air 708 that is provided to recirculation opening 204 and to the cooling module 104. Fans 514 may blow the cool air 708 into IT module 106 to cool IT equipment. Dampers in exterior exhaust openings 210 and exterior intake openings 208 may be controlled to adjust air flow in the mixing aisle to obtain a desired temperature of cool air 708 and thus a desired temperature within the IT module 106. The mixing operation mode described above uses less energy than the modes of FIG. 5 and FIG. 6, and thus may be preferred when exterior conditions are sufficient for this mixing operation. The reduced cost of this mixing operation mode reduces the overhead of operating information handling systems in IT module 106.

Figure 8:
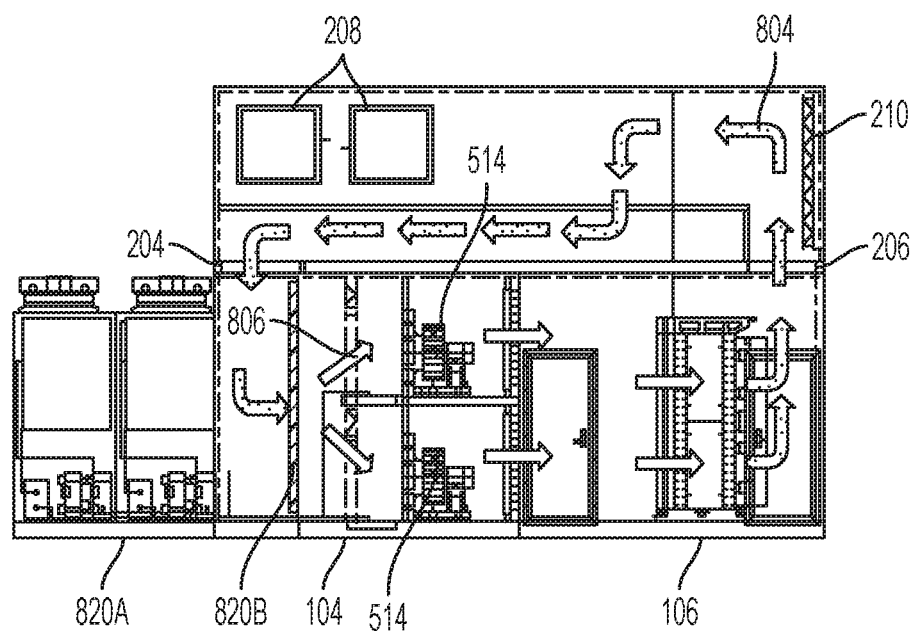
FIG. 8 is a cross-sectional view of a data center showing airflow in the data center when exterior intake dampers are closed and air is recirculated from an interior intake opening and cooled to cool the IT equipment according to one embodiment of the disclosure.

Dampers in the exterior exhausts and intakes of the mix module may be closed and a cooling system activated to operate the IT module 106 with recirculated and chilled air. A recirculated chilled operation mode is shown in FIG. 8. FIG. 8 is a cross-sectional view of a data center showing airflow in the data center when exterior intake dampers are closed and air is recirculated from an interior intake opening and cooled to cool the IT equipment according to one embodiment of the disclosure. Warm air 804 from the IT module 106 may be received through the opening 206 and passed to the mixing aisle around closed exterior exhaust openings 210. The exterior intake openings 208 may also be closed and the mix dampers open such that the warm air 804 is passed to recirculation opening 204 without any mixing with other air in the mix module 108. The warm air 804 may then be passed through a cooling system 820 (e.g., cooling components 820A and 820B) to produce cool air 806. Fans 514 may blow the cool air 806 into the IT module 106. In one embodiment, the cooling system 820 may be a direct cooling system with compressors 820A and evaporator coils 820B. In another embodiment, the cooling system 820 may be an evaporative cooler, a heat exchanger, or any other cooling system.

Figure 9:
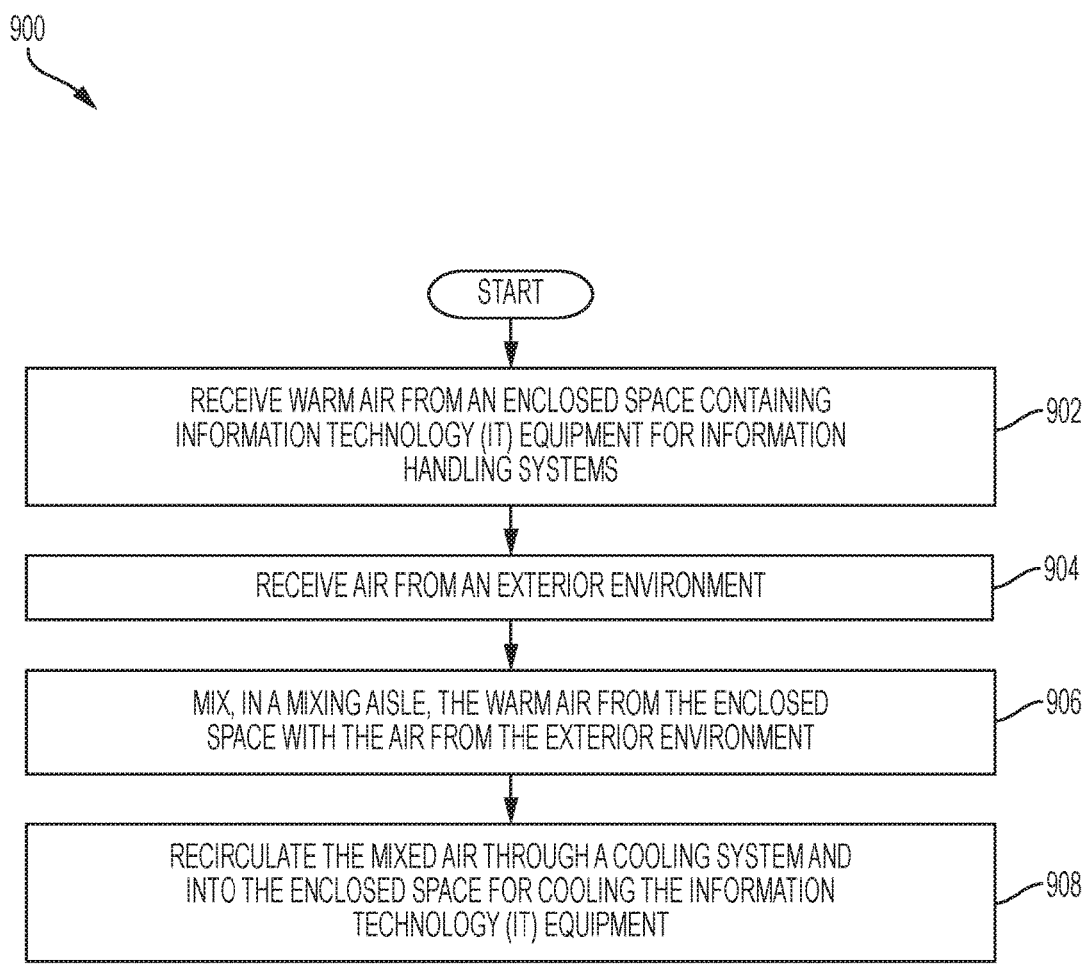
FIG. 9 is a flow chart illustrating a method of mixing and recirculating air in a mixing module according to one embodiment of the disclosure.

Operation of a mix module will now be described with reference to FIG. 9 and FIG. 10. FIG. 9 is a flow chart illustrating a method of mixing and recirculating air in a mixing module according to one embodiment of the disclosure. A method 900 describes mixing and recirculation of air such as described above with reference to FIG. 7 and may include, at block 902, receiving warm air from an enclosed space containing information technology (IT) equipment for information handling systems. Then, at block 904, air may be received from an exterior environment. Next, at block 906, the warm air from the enclosed space may be mixed with air from the exterior environment. Then, at block 908, the mixed air may be recirculated through a cooling system and into the enclosed space for cooling the information technology (IT) equipment. When recirculating the air through the cooling system, the cooling system may be active or inactive. When the cooling system is inactive, the air may be passed through to the IT equipment without chilling or other processing. The operation of the mix module described in FIG. 9 describes only one of the operational modes of a mix module. Additional operational modes may be executed as part of operation of the mix module, such as those described above with reference to FIG. 5, FIG. 6, FIG. 7, and FIG. 8.

A controller may be configured to monitor conditions in the enclosed space, mix module, and/or exterior environment and control the mix module to obtain desired conditions, such as a specific temperature and/or humidity level or a specific temperature range and/or humidity level range, within the enclosed space. The controller may be located in the mix module or another module of the modular data center. When the controller is in a different module, the cooling module may be connected to the other module through a connection that includes, for example, one or more low-voltage control signal lines. The controller may include a computer system, hard-wired logic, a thermostat, and/or a programmable logic controller (PLC). The controller may receive information from sensors, such as temperature sensors and humidity sensors, positioned through the mix module, the IT module, and/or the cooling module, and/or external temperature and humidity sensors. The controller may be programmed with a defined rule set and/or adaptable logic to control equipment within the mix module and/or cooling module to obtain a desired result, such as a specific temperature and/or humidity level or a specific temperature range and/or humidity level range. Controllable equipment within the mix module may include mix dampers, exterior intake opening dampers, interior intake opening dampers, and/or exterior exhaust dampers. The controller may also include capability to operate equipment outside of the mix module that affects temperature within the enclosed space, such as the air conditioning, evaporative cooling units, and/or fans within the cooling module and/or the IT module. Controllable equipment within the cooling module may include fans, evaporative coolers, and/or direct air conditioning systems.

One example of a method for controlling conditions within an enclosed space is described with reference to FIG. 10. FIG. 10 is a flow chart illustrating a method of controlling dampers within a mixing module according to one embodiment of the disclosure. A method 1000 may include, at block 1002, determining temperature conditions in the exterior environment and in the enclosed space. At block 1004, the conditions may be examined to determine if the conditions allow recirculating mixed air to obtain sufficiently cool air. For example, it may be determined at block 1004 if the exterior temperature is below a certain threshold, such as fifty degrees Fahrenheit. If not, then the method 1000 may continue to block 1006 to close the mix dampers and activate a cooling system. The block 1006 may include other steps that are part of configuring the mix module for operation in the configuration of FIG. 6 or FIG. 8. If the conditions do allow using recirculated mixed air at block 1004, then the method continues to block 1008 to determine if the conditions require additional cooling. If so, then the method 1000 continues to block 1010 to open mix dampers and activate the cooling system. Block 1010 may include other steps that are part of configuring the mix module for operation in the configuration of FIG. 7 with the cooling system activated. If no additional cooling is required, then the method 1000 may continue to block 1012 to open mix dampers and de-active the cooling system. Block 1012 may include other steps that are part of configuring the mix module for operation in the configuration of FIG. 7 with the cooling system de-activated. The method 1000 may continue back to block 1002 to continue to monitor for changes in temperature conditions that would trigger a change in operating mode of the mix module. Further, while within an operating mode, the conditions may be monitored and adjustments made such as to the amount that various dampers are opened or closed to obtain a desired temperature in the enclosed space.

Figure 10:
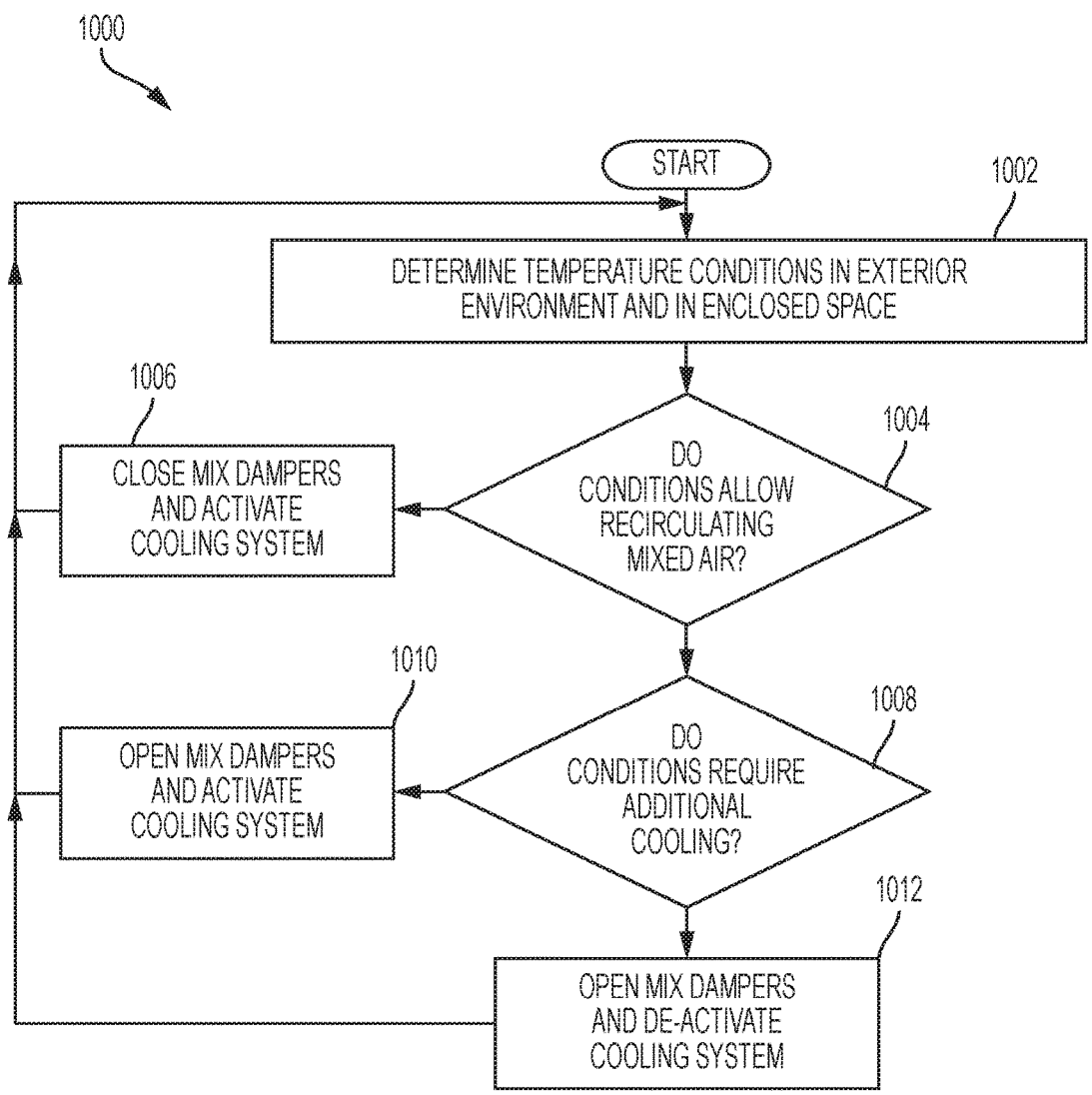
FIG. 10 is a flow chart illustrating a method of controlling dampers within a mixing module according to one embodiment of the disclosure.

The schematic flow chart diagrams of FIG. 9 and FIG. 10 are generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
a prefabricated infrastructure module (PIM) for mixing configured to provide air handling for an information handling system in an enclosed space, the prefabricated infrastructure module (PIM) comprising:
an interior intake opening configured to receive warm air from a warm aisle of the enclosed space;
an exterior intake opening configured to receive air from an exterior environment;
a mixing aisle configured to receive air from the interior intake opening and from the exterior intake opening and further configured to allow mixing of air from the warm aisle and air from the exterior environment;
a recirculation opening coupled to the mixing aisle and configured to output mixed air from the mixing aisle for recirculation through the enclosed space to cool the information handling system; and
an exhaust opening coupled to the mixing aisle and configured to allow exhaust of air from the mixing aisle to the exterior environment,
wherein the PIM comprises multiple levels, and wherein the mixing aisle traverses substantially an entire length of the PIM multiple times while passing through the multiple levels, wherein a first portion of the mixing aisle traverses substantially the entire length of the PIM at a first level of the multiple levels and a second portion of the mixing aisle traverses substantially the entire length of the PIM at a second lower level of the multiple levels, and wherein the first portion and the second portion of the mixing aisle are separated by a divider traversing at least a portion of the length of the PIM, and wherein the mixing aisle is configured to channel air from the exterior intake through the first portion of the mixing aisle and the second portion of the mixing aisle, around the divider, to the recirculation opening.

2. The apparatus of claim 1, wherein the exterior intake opening comprises a single opening configured to receive air from the exterior environment when the PIM is configured for mixing and when the PIM is configured for not mixing.

3. The apparatus of claim 2, wherein the mixing aisle is divided into two portions by a set of mix dampers, wherein the mix dampers are configured to open and close to control airflow through the mixing aisle, and wherein:

in a first mode, the set of mix dampers are at least partially open to allow the mixing of the warm air and air from the exterior environment; and in a second mode, the set of mix dampers are closed to allow only air from the exterior environment to flow to the enclosed space.

4. The apparatus of claim 3, wherein the PIM further comprises a controller configured to control the set of mix dampers to switch between the first mode and the second mode.

5. The apparatus of claim 4, wherein the controller is further configured to adjust the set of mix dampers to obtain a desired temperature and humidity level within the enclosed space.

6. The apparatus of claim 1, wherein the PIM further comprises intake dampers in the exterior intake opening, wherein the intake dampers are configured to open and close to control airflow from the external environment into the mixing aisle.

7. The apparatus of claim 1, wherein the exhaust opening comprises exhaust dampers, wherein the exhaust dampers are configured to open and close to control airflow from the mixing aisle to the external environment.

8. The apparatus of claim 1, wherein the PIM is configured to attach to a modular data center comprising a cooling module and an information technology (IT) module.

9. An information handling system, comprising:

an enclosed space for information for information technology (IT) equipment, wherein the enclosed space comprises a first region of warmer air and a second region of cooler air;

a cooling system attached to the enclosed space; and a prefabricated infrastructure module (PIM) for mixing configured to provide air handling for the enclosed space, wherein the prefabricated infrastructure module (PIM) comprises:

an interior intake opening configured to receive the warmer air from the first region of the enclosed space;

an exterior intake opening configured to receive air from an exterior environment;

a mixing aisle configured to receive air from the interior intake opening and from the exterior intake opening and further configured to allow mixing of the warmer air and air from the exterior environment;

a recirculation opening coupled to the mixing aisle and to the cooling system and configured to output mixed air from the mixing aisle to the cooling system for recirculation through the enclosed space to cool the information handling system; and an exhaust opening coupled to the mixing aisle and configured to allow exhaust of air from the mixing aisle to the exterior environment, wherein the PIM comprises multiple levels, and wherein the mixing aisle traverses substantially an entire length of the PIM multiple times while passing through the multiple levels, wherein a first portion of the mixing aisle traverses substantially the entire length of the PIM at a first level of the multiple levels and a second portion of the mixing aisle traverses substantially the entire length of the PIM at a second lower level of the multiple levels, and wherein the first portion and the second portion of the mixing aisle are separated by a divider traversing at least a portion of the length of the PIM, and wherein the mixing aisle is configured to channel air from the exterior intake through the first portion of the mixing aisle and the second portion of the mixing aisle, around the divider, to the recirculation opening.

10. The information handling system of claim 9, wherein the PIM comprises a single opening configured to receive air from the exterior environment when the PIM is configured for air conditioning by mixing and when the PIM is configured for air conditioning by cooling.

11. The information handling system of claim 10, further comprising a set of mix dampers configured to divide the mixing aisle into two portions, wherein the mix dampers are configured to open and close to control airflow through the mixing aisle, and wherein:

in a first mode, the set of mix dampers are at least partially open to allow the mixing of the warmer air and air from the exterior environment; and in a second mode, the set of mix dampers are closed to allow only air from the exterior environment to flow to the cooling system.

12. The information handling system of claim 9, wherein the enclosed space is part of an information technology (IT) module, and wherein the PIM is configured to attach to the information technology (IT) module and a cooling module comprising the cooling system.

13. A method, comprising:

receiving warm air from an enclosed space containing information technology (IT) equipment for information handling systems;

receiving air from an exterior environment;

mixing, in a mixing aisle, the warm air from the enclosed space with the air from the exterior environment;

recirculating the mixed air through a cooling system and into the enclosed space for cooling the information technology (IT) equipment;

exhausting air through an exhaust opening coupled to the mixing aisle and configured to allow exhaust of air from the mixing aisle to the exterior environment, wherein the mixing aisle traverses substantially an entire length of a multi-level prefabricated infrastructure module (PIM) multiple times while passing through the multiple levels of the PIM, wherein a first portion of the mixing aisle traverses substantially the entire length of the PIM at a first level of the multiple levels and a second portion of the mixing aisle traverses substantially the entire length of the PIM at a second lower level of the multiple levels, and wherein the first portion and the second portion of the mixing aisle are separated by a divider traversing at least a portion of the length of the PIM, and wherein the mixing aisle is configured to channel air from the exterior environment through the first portion of the mixing aisle and the second portion of the mixing aisle, around the divider, to the enclosed space.

14. The method of claim 13, wherein the mixed air is recirculated in a first mode, and wherein the method further comprises operating in a second mode by directly cooling air from the exterior environment without mixing.

15. The method of claim 14, wherein the received air from the exterior is received through a single opening whether operating in the first mode or the second mode.

16. The method of claim 14, further comprising operating mixing dampers to control the exit of air from the mixing aisle to be recirculated to switch between the first mode and the second mode.

17. The method of claim 13, further comprising operating exhaust dampers to control exhaust of warm air to control a temperature within the enclosed space.

18. The method of claim 13, further comprising operating intake dampers to control intake of exterior air to control a temperature within the enclosed space.

* * * * *